United States Patent [19]

Southworth et al.

[11] Patent Number: 4,540,326

[45] Date of Patent: Sep. 10, 1985

[54] SEMICONDUCTOR WAFER TRANSPORT SYSTEM

[75] Inventors: Peter R. Southworth, Mission Viejo; Gregory R. Baxter, Orange, both of Calif.

[73] Assignee: Nacom Industries, Inc., Tustin, Calif.

[21] Appl. No.: 419,201

[22] Filed: Sep. 17, 1982

[51] Int. Cl.³ .............................................. B65G 35/00
[52] U.S. Cl. ................................ 414/217; 104/138 R; 104/165; 118/500; 198/619; 414/340
[58] Field of Search .................... 104/138 R, 154, 165, 104/287, 288; 105/365; 191/10; 198/619, 805, 861; 46/234, 235, 239, 240; 308/10; 446/133–136; 414/217, 291, 292, 340; 432/239, 253; 118/500, 719, 728, 729

[56] References Cited

U.S. PATENT DOCUMENTS

| | | | |
|---|---|---|---|
| 516,188 | 3/1894 | Dewey | 191/10 |
| 1,171,972 | 2/1916 | Myers | 46/235 X |
| 2,691,946 | 10/1954 | Marmo | 191/10 X |
| 3,202,406 | 8/1965 | Tack | 198/619 X |
| 4,075,972 | 2/1978 | Yamawaki et al. | 118/500 X |
| 4,166,563 | 9/1979 | Peyraud et al. | 198/619 X |
| 4,214,972 | 7/1980 | Shintock | 198/472 X |
| 4,231,294 | 11/1980 | Arzoumanian | 104/138 R |
| 4,389,967 | 6/1983 | Shimoda et al. | 104/138 R X |
| 4,392,435 | 7/1983 | Moody et al. | 104/281 X |
| 4,394,895 | 7/1983 | Ginniff et al. | 198/619 X |

FOREIGN PATENT DOCUMENTS

| | | | |
|---|---|---|---|
| 1813995 | 12/1969 | Fed. Rep. of Germany | 104/138 R |
| 2741895 | 3/1979 | Fed. Rep. of Germany | 46/240 |
| 83422 | 6/1964 | France | 46/240 |
| 2055985 | 5/1971 | France | 414/292 |
| 2000736 | 1/1979 | United Kingdom | 104/138 R |

Primary Examiner—Randolph A. Reese
Attorney, Agent, or Firm—Knobbe, Martens, Olson & Bear

[57] ABSTRACT

A system is described for the automated transfer of wafer carriers containing semi-conductor wafers, to various work stations and processing units along a process line. The system includes tunnel and track segments which are joined to provide a path of desired length. A semi-conductor carrier rides on a cart, which is in one tunnel and is magnetically coupled to a motorized cart which is in a separate tunnel to keep contaminants away from the wafer carrier. The tunnel enclosing the wafer carrier is also purged with nitrogen or filtered air to keep contaminants away from the carrier.

13 Claims, 5 Drawing Figures

SEMICONDUCTOR WAFER TRANSPORT SYSTEM

BACKGROUND OF THE INVENTION

This invention relates to a transport system by which semi-conductor wafers can be carried from station to station for processing into integrated circuits. Circular, semi-conductor wafers up to six inches in diameter but only 15-20 thousandths of an inch thick are common in the semi-conductor industry. A non-conductive base, such as silicon, is coated with a metallic conductive material to form the semi-conductor wafers. After these wafers are coated and baked they are typically sent to a photoresist area where photographically reduced circuitry is imprinted upon the wafers by a process of photo reduction, masking, etching, and processing. A multitude of extremely small and complex circuits are etched out of the conductive layer on the semi-conductor material. After leaving the photoresist area the semi-conductive wafer may be transported to a dry process area and subsequently onto a pre-diffusioned cleaning area, or back to the photoresist area to have a second circuit overlayed onto the first. Alternately, after the photoresist, the semi-conductor wafer may go to an ion implant area where ion impurities are forced into the conductive material; from the implant area the wafer is sent onto either the pre-diffusion clean area or back to the dry process area. Semi-conductive wafers leaving the pre-diffusion clean area pass either through a metals area or onto a furnace load station wherein the semi-conductor materials are heated to an elevated temperature in order to finish the processing step.

Since the circuitry printed on the semi-conductor wafers is extremely small, it only takes a small sized particle to either short circuit the imprinted circuitry or alternately, to block processing chemicals from reaching every portion of the circuitry imprinted on the semi-conductor wafer. It is thus essential that even tiny contaminants be kept out of the semi-conductor processing areas.

Several of the separate processing areas, such as the furnace or the ion implant area operate in a controlled environment. There is a danger of contamination, however, when the wafers are transported from one processing area to the next, or when the wafers travel within a processing area which does not have a controlled environment.

Some of the present systems to prevent contamination consist merely in enclosing the wafers in a closed box during transportation. Such an enclosure does not prevent contamination from the airborne particulates entrapped within the box.

Accordingly, one object of this invention is to provide an improved transport system whereby semi-conductor wafers can be transferred from one processing area to the next with minimal risks of contamination.

Another object of this invention is to provide an improved transport system whereby semi-conductor wafers can be transferred within a single processing area when the processing area does not have a controlled, particulate-free environment.

Since the wafers are extremely thin and the circuitry printed upon them is even thinner, the danger of abrasion, scratches, and even breakage of the wafer cannot be ignored. Every time the wafer is physically handled, or subjected to a shock the chances of contamination and damage are increased.

Early transport techniques included manually carrying the wafers either individually or in boxes from the processing area to the next. The batch transportation of a number of wafers in a single carrier further opens the entire batch of wafers to contamination or damage from shock loads since the chances are that one wafer will be subjected to the same contaminant or shock load as the adjacent wafers.

Early attempts to automate the transport process by the use of conveyor belts and platens or by air or vibratory tracks did not solve either the contamination of the abrasion problem. The conveyor systems subjected the wafers to numerous vibratory loads. The air transport systems increased the risk of contamination through the very air used to transport the wafers. Vibratory tracks increased the abrasion of the wafers and platen conveyor systems subjected the wafers to numerous vibrations as they rolled over each platen, thereby increasing the chances of abrasion and increasing the shock loads tending to fracture the wafers.

Accordingly, a still further ojbect of this invention is to provide an automated transport system which minimizes the manual handling of the semi-conductor wafers or of the carriers, thereby minimizing the chances of contamination or the possibility of scratching or breaking the fragile wafers.

SUMMARY OF THE INVENTION

In accordance with this invention, a system for the automated transfer of semi-conductor carriers is provided which minimizes the dangers of contamination and possibility of abrasion. The coated and baked semi-conductor wafers are batch loaded into a carrier and placed on a driven cart which travels in a positively pressurized tunnel in order to prevent atmospheric contaminants from entering said tunnel. In order to prevent contaminants from the drive system from affecting the semi-conductor wafers, the drive unit is preferably sealed in a separate tunnel. Magnetic coupling with the driver cart propels the driven cart and the carrier which contains the wafers.

In a preferred form of the invention, the basic segment of the transport system consists of a track-like support structure which has an outer tunnel-like cover mounted thereon. The outer cover extends the length of the support structure and forms a tunnel-like enclosure within which the driven cart and wafers travel. A plenum chamber located at the top of the outer cover contains gas transport means whereby an inert gas can be used to positively pressurize the volume contained in the outer cover. The driven cart straddles a tunnel-like inner cover which extends the length of the support structure and prevents contaminants within the inner cover from escaping into the outer tunnel, thereby contaminating the wafers. Inside of this inner tunnel is a driver cart carrying magnets which are located near magnets mounted on the driven cart. The driver cart is powered by an electrical motor which gets its power from a spring loaded contact sliding a power rail mounted on the support structure. Thus, as the electric motor causes the driver cart to move, the magnets on the driver cart exert a magnetic force on the corresponding magnets on the driven cart; the magnetic force being sufficient to cause the driven cart to track the motion of the driver cart.

In order to allow the driver cart and driven cart to make turns without causing the wheels to slide and thereby generate particulate contaminants, the preferred embodiment of this invention uses a two segmented cart. Two of the four wheels on the cart are mounted to a pivot section. This pivot section in turn is connected to a bearing which allows rotation around a pivot axis which is perpendicular to the plane of the four wheels of the cart. In order to allow flexible layout of the material transport system, the track segments are produced in relatively short sections. Structural interconnections on the support base provide for structural rigidity and inter-connection.

By connecting several of the straight or curved track segments a wafer transport system can be readily constructed to adapt to the existing layout of a semi-conductor processing plant.

DETAILED DESCRIPTION

Figure 1:
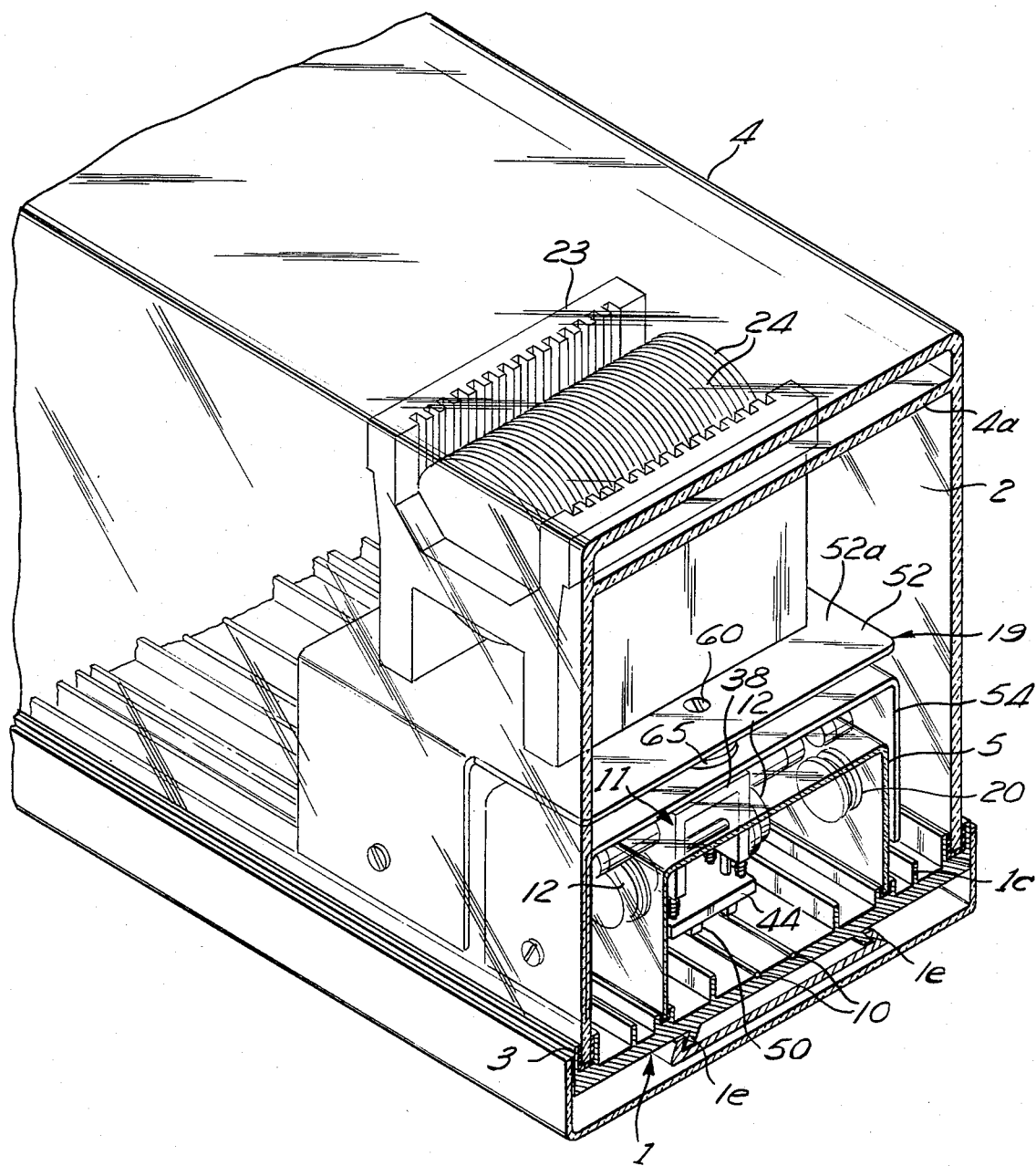
FIG. 1 is a perspective view of the tunnels and carts of the conveyor system of the invention, showing the driven cart straddling the driver cart and showing a cut-away view of the electrical power pickup.
Figure 2:
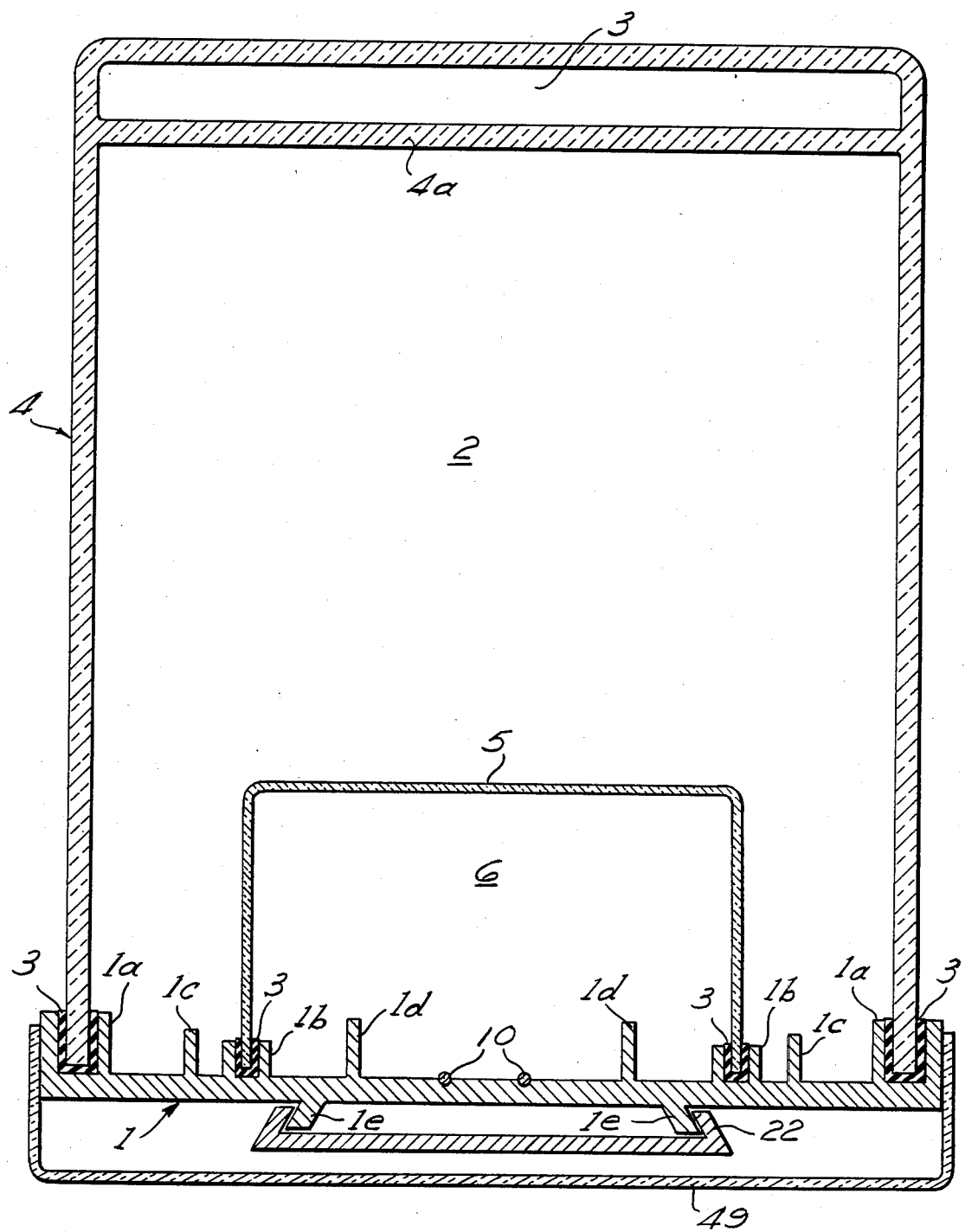
FIG. 2 is a cross sectional view of the cover and support structure forming the tunnels of FIG. 1.

Referring to FIGS. 1 and 2, there is shown an elongated tunnel track segment including a track-like support structure 1, from which is preferably formed as a one-piece extrusion of aluminum or other suitable material. As may be seen, the track is formed on its upper surface with a series of short upstanding walls. A pair of outer walls 1a on each of the outer edges of the track form a U-shaped groove along each outer edge for receiving the side walls of a large, generally U-shaped outer cover 4, which is preferably made of transparent plastic. Together, the track 1 and the cover 4 form an outer tunnel 2.

A horizontal wall 4a located near the top of outer cover 4 and formed integral therewith forms a plenum 3.

The support structure 1 is further formed with two sets of inner walls 1b that form a pair of spaced grooves for receiving the sides of a U-shaped inner cover 5. The cover 5 in combination with the structure 1 forms an inner tunnel 6. Suitable U-shaped seals 3 positioned in the grooves formed by the walls 1a and 1b cooperate with the lower edge of the cover side walls to seal the tunnels 2 and 6.

The track walls 1c form a pair of outer rails for receiving the wheels of an outer driven cart, and the track walls 1d form a pair of inner rails for receiving the wheels of an inner driver cart. Note that the outer rails 1c are located between the grooves for the inner and outer covers, and the inner rails are located within the inner cover.

Also formed in the upper side of the track 1, between the inner rails 1d are a pair of grooves receiving electrical conductors 10, which provide for electrical power take off along the length of the track. The aluminum track is teflon-impregnated, hard anodized, which renders the exterior surface non-conductive, and thus the bare conductors 10 may be positioned directly in the grooves.

The track 1 is further formed with a pair of elongated ribs 1e which depend downwardly and outwardly from the lower surface of the track and interlock with corresponding channel-shaped connection pieces 22 for joining two segments of track 1 in end-to-end alignment.

Figure 3:
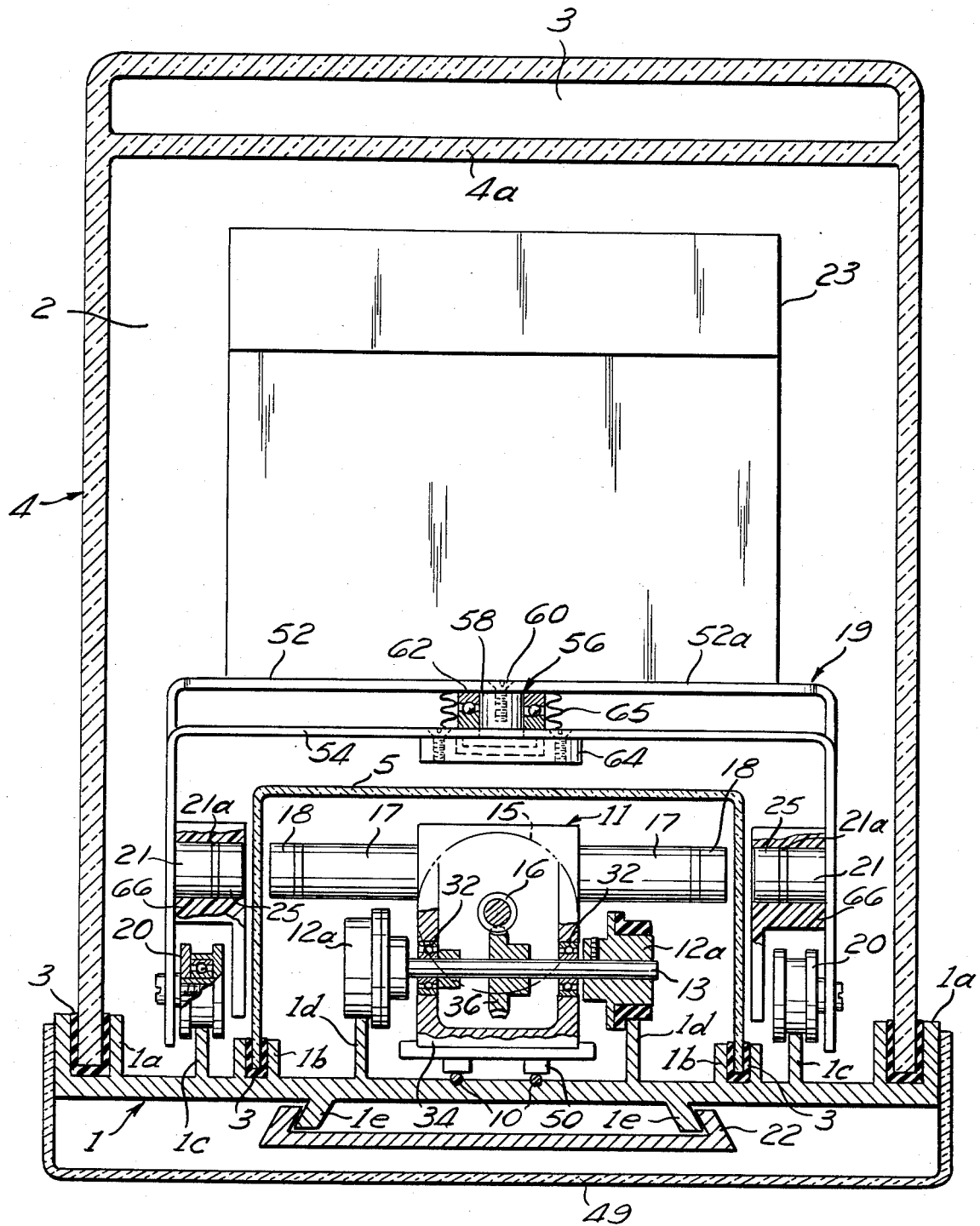
FIG. 3 is a sectional view, showing the driver cart and the driven cart within the tunnels.
Figure 4:
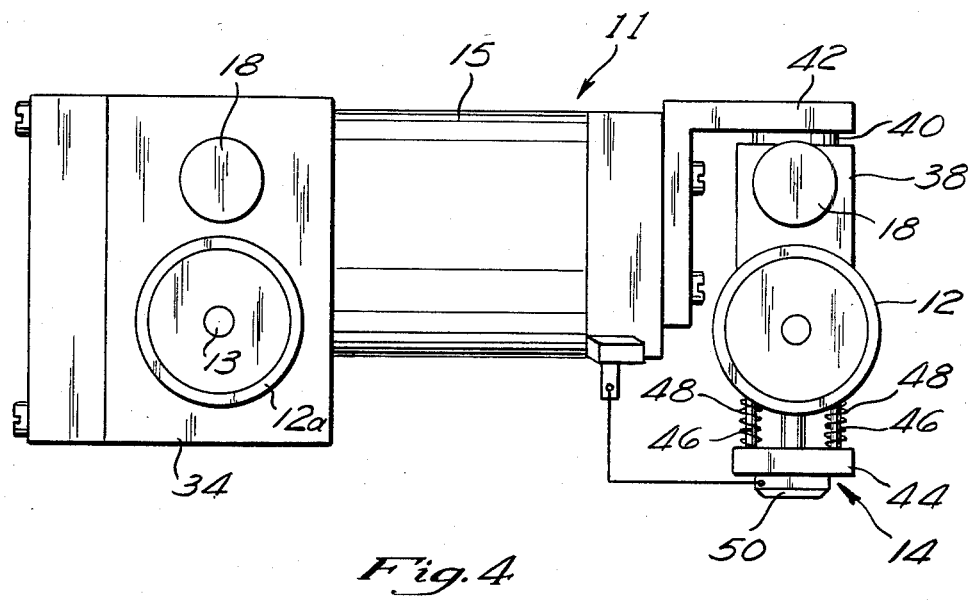
FIG. 4 is a side elevational view of the inner cart.

Referring now to FIG. 3, as well as FIGS. 1 and 4, there is shown an outer driven cart straddling an inner driver cart 11. The driver cart 11 is mounted on four single flanged wheels 12 which ride on the inner rails 1d. Two of the wheels 12 are mounted on bearings which allow free rotation of the wheels, and the other two wheels 12a are rigidly mounted to a driver axle 13 to form drive wheels. The wheels have an exterior covering of urethane or other suitable material that provides the necessary frictional engagement with the rails 1d. The axle 13 is rotatably mounted on suitable bearings 32 mounted on a gear housing 34 connected to an electric motor 15. The motor drive shaft carries a worm gear 16 which drives a worm wheel 36 mounted on the axle 13 to propel the cart. The cart 11 is preferably formed of two segments to allow it to accommodate a curve. The axle 13 and its wheels 12a, together with the housing 34 and motor 15, form a drive segment. The other set of wheels 12 are mounted on a U-shaped yoke 38 which is pivotally mounted by a bearing 40 to a pivot bracket 42 attached to the motor 15. Thus the yoke 38, together with its wheels, can pivot about a vertical axis independently of the drive segment.

Also mounted on the pivotable segment is an electric pick-up assembly 14 for providing power to the motor 15. As seen from FIGS. 1 and 4, the power pick-up includes a plate 44 slidably mounted on four tubular pins 46 supported in the lower ends of the yoke 38, and retained by two screws (not shown). Springs 48 surrounding the pins 46 urge the plate downwardly so that a pair of contact shoes 50 are continuously urged into slidable contact with the conductors 10. The contact shoes are, of course, connected by a suitable conductor to the motor.

The electrical connections bringing power to the conductors 10 may conveniently be located beneath the track 1 in an enclosed space formed by a lower channel-like cover 49, which is secured to the track 1, and also forms a support surface for the system. Other electrical controls for controlling the movement of the driver carts may be conveniently housed in that space. The cover 49 also encloses the connecting pieces 22 which join sections of track 1.

Referring to FIG. 3, four post-like arms 17 are located one above each of the wheels 12 and 12a. At the end of each arm 17 is mounted a rare earth magnet 18. The length of the arms 17 is such as to place the magnets 18 in close proximity to the inner cover 5. Inner cover 5 is of magnetically permeable material such as abrasion resistant clear acrylic. (The arms and magnets above the pivot wheel segment of the cart 11 are not shown in FIG. 1 so as to simplify that drawing.)

Referring to FIGS. 1-3, the driven cart 19 has a segmented construction supported on four double flanged wheels 20 which in turn ride on the outer rails 1c of the track 1. The driven cart 19 includes two U-shaped yokes 52 and 54 which straddle the inner cover 5 and the driver cart 11, with two wheels being mounted on stub shafts mounted on the inside of the side walls of each yoke. The yoke 52 includes a flat upper plate 52a for supporting a load such as a cassette or carrier 23 holding a group of semi-conductor wafers 24. The yoke 54 is pivotally mounted on a thrust bearing 56 secured to a portion of the plate 52a extending over the yoke 54. The thrust bearing permits the yoke 54 to pivot independently of the yoke 52 so that the cart can negotiate curved tracks, with a minimum of sliding wheel contact. This reduces the generation of particulate contaminants which would have an adverse effect should they come in contact with the wafers 24.

The driven cart wheels 20 are mounted on special double sealed bearings having sealed therein a low outgassing lubricant. Such a bearing not only permits each wheel to rotate freely on its axle with low friction, but also is a very low generator of particulate matter that might contaminate the wafers.

The wheels 20 are made of aluminum which has been teflon-impregnated, hard anodized as with the surface of the track 1 on which the wheels ride. The resulting corrosion resistant contacting surfaces have a very low coefficient of friction and are extremely hard and durable, providing superior wear characteristics to prevent contaminant generation in the wafer area. In addition to the cleanliness aspect, reliable, uniform movement of the driven cart is of course important. Some materials tend to produce particles that interfere with the smooth rotation of the wheels, such that with the magnetic drive arrangement, jerky movement of the cart may occur or actual stalling. Unreliability is unacceptable, and jerks or jolts may damage the delicate wafers.

The bearing 56 includes a bearing bushing 58 which extends through the yoke 54 and is secured to the yoke 52 by a fastener 60. A bearing element 62 surrounds the bushing 58 and extends between the yokes 52 and 54, holding them in spaced relation, with the head of the bushing 58 engaging the undersurface of the yoke 54. A cap 64 secured to the yoke 54 enables the head of the bushing to capture any particulates generated by the sliding contact between the bushing head and the yoke 54. A teflon bellows 65 surrounding the bushing shank and the element 62 engages the yokes 52 and 54 to confine any particulates generated in that area, while not interfering with the movement of the components.

Referring to FIG. 3, suitable plastic shields 66 attached to the inner sides of the yoke side walls enclose each of the wheels 20 on the driven cart 19. Such shields deflect any particles downward, away from the wafer carrier 23. (The shields are not shown in FIG. 1, to simplify that figure.)

Each of the shields 66 also supports a rare earth magnet 25, a steel spacer 21a, and a spacer plug 21. The size of the plugs 21 and the magnets 25 is such as to place the magnets in close proximity to the inner cover 5. The spacing and location of the four magnets 25 is such as to cause the magnets 22 to be aligned with the magnets on the driver cart 11, such that the only thing separating magnets 18 from magnets 25 is the magnetically permeable inner cover 5, a small air gap on either side of said inner cover and a thin layer of plastic on the face of the magnets 25, the latter to prevent particles from leaving the magnet surface.

Still referring to FIG. 1 note that the carrier 23 mounted on the driven cart 19 holds the semi-conductor wafers 24 which are shown in an edge view in FIG. 3. Orienting the semi-conductor wafers 24 with the edge located along the direction of travel of the driven cart 19 is the preferred orientation since the forces exerted by stopping and starting the cart 19 will act along the strongest axis of the semi-conductor wafers 24, thus minimizing possibilities of wafer damage.

From the foregoing, it may be seen that the driven cart 19 with its load of wafers moves in a contaminant-free, sealed tunnel 2. Where sections of the covers 4 and 5 forming the tunnel are joined at their ends, suitable seal elements (not shown) may be employed to reduce leakage in that area. Positive pressurization of the tunnel 2 is achieved by transporting filtered air or nitrogen through the plenum 3 formed in the top of the outer cover 4 and distributing the gas downwardly through suitable openings (not shown) in the wall 4a. Suitable vents (not shown) in the lower portion of the tunnel 2 permit a controlled flow of the purging gas downwardly in the tunnel directing any particulates formed by the carts away from the wafers. Positive pressurization of the tunnel 2 also, of course, prevents atmospheric contaminants from entering the outer tunnel 2 and prevents contaminants from escaping the area enclosed by the inner cover 6.

Figure 5:
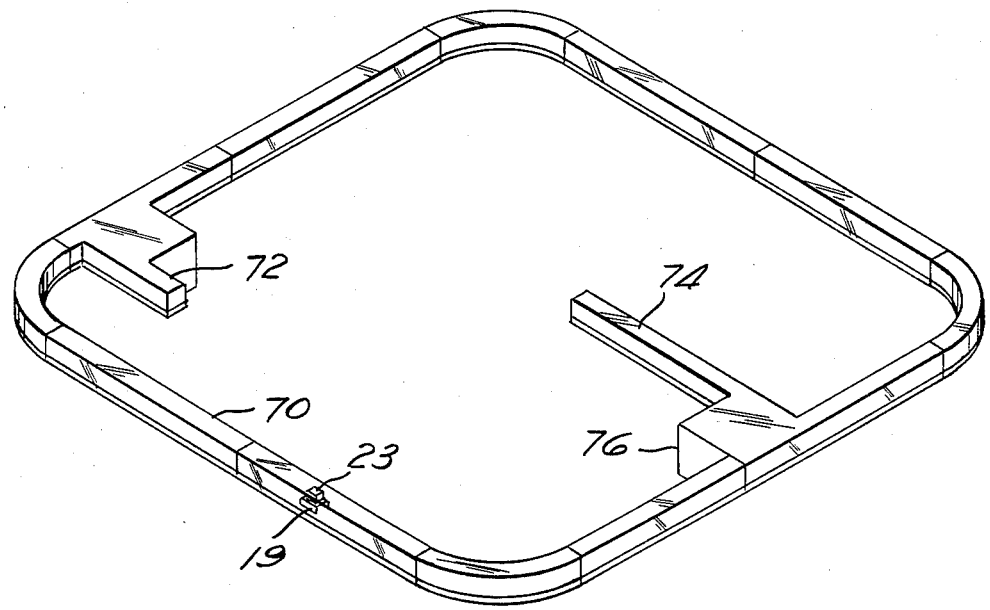
FIG. 5 is a schematic view illustrating the transport system of the invention having straight and curved segments, as well as a carrier transfer device.

FIG. 5 illustrates a series of tunnel sections or modules interconnected in end-to-end relation to form a closed loop 70. The straight and curved sections can be arranged in any desired pattern to meet the various needs of a processing operation. Typically, the tunnel modules are made in eight foot lengths and the curved sections have a three foot radius which enables the carts to turn corners without jostling the wafers or unduly generating particulates.

Also illustrated in FIG. 5 are two spur lines 72 and 74 which extend at right angles to the main loop portion which it intersects. Such spur lines may be useful as links to process stations in situations where a more gradual curved tunnel section is not practical or where there are different elevations involved. A robot-type load transfer mechanism schematically illustrated at 76 is employed to transfer a wafer carrier 23 and its load 24 from the main loop to the spur or vice versa. More specifically, by way of example, the transfer mechanism 76 will automatically, or by remote control, reach out and grasp the wafer carrier 23 which has been stopped at that intersection, lift the carrier and withdraw it out of the tunnel 2, move the carrier 90°, reach out and place it on a cart in the tunnel of the spur loop, and then withdraw. The transfer mechanism 76 is open to the tunnel 2 in the main and spur lines and also subjected to the purging gas to keep particulates away from the carrier load when the transfer is made.

Similar operations of the type illustrated can, of course, be employed in a wide variety of process situations utilizing the conveyor system of the invention. Several spur lines may lead from a central processing station surrounded by a conveyor loop leading to other stations. At a particular station the carrier may be removed manually or automotively and placed into a processing apparatus.

The system also contemplates the use of a group of carts operating in the conveyor at the same time. Suitable control signals for controlling independent movement of the carts may be provided utilizing techniques similar to that employed with model trains. Also the overall positioning and movement of the carts may be controlled by a suitable computer.

There are many advantages of the above-described system, the primary one being that the loads being moved can be transported in a manner to minimize the possibilities of contamination and breakage. Secondly, the loads can be transferred quickly and reliably from one station to the next, including transferring through a wall of a room, to increase the efficiency and productivity of a wafer processing operation.

We claim:

1. A wafer transport system for minimizing the danger of contamination to the wafers being carried by the system comprising:

an elongated, track-like support having a pair of inner tracks on the upper side of the support means on said support located between said inner tracks for conducting electrical power a driver cart riding on said inner tracks an electric motor included with the driver cart an electrical power pick-up on the cart for transferring electricity from the power conducting means to the electric motor a generally U-shaped inner cover supported in an inverted orientation on said track-like support to form, with the support, an inner tunnel through which said driver cart can travel, said support having means spaced outwardly from said inner tracks to sealingly cooperate with the lower edges of the side legs of said cover a pair of outer tracks on said support including a track on each side spaced outwardly from but in close proximity to means on the support for receiving the lower legs of said cover a driven cart having a generally U-shaped support structure positioned in an inverted orientation with an upper support surface and depending side legs, and having wheels rotatably mounted on the lower ends of said structure side legs, the driven cart wheels being aligned to ride on said outer tracks, with the side legs of the driven cart structure being spaced outwardly from the side legs of the inner cover to straddle and enclose the inner cover and the driver cart, said driven cart including an upper support surface spaced above and extending over the upper wall of the inner cover, said upper support surface being adapted to support a wafer carrier on said surface, remote from the wheels on said driven cart magnetic means on said driver cart extending outwardly in close proximity to the inner surface of said inner cover, and magnetic means on said driven cart structure and extending closely adjacent to the outer surface of said inner cover and aligned with the magnetic means on said driven cart so that sufficient magnetic force can be exerted by the magnetic means on the driver cart to cause the driven cart to follow the motion of the driver cart and an outer generally U-shaped cover arranged in an inverted orientation fitting over the driven cart and the space to be occupied by a wafer carrier on top of the driven cart so that the outer cover in combination with the inner cover and said support forms an outer tunnel through which said driven cart can travel, said support being formed with means on its upper surface spaced outwardly from said outer tracks for sealingly cooperating with the lower ends of the side legs of the outer cover.

2. The system of claim 1, wherein the magnetic means on the driven cart are magnets covered by a thin layer of plastic to prevent particles from leaving said magnets.

3. The wafer transport system of claim 1 further comprising:

a robot-type load transfer mechansim to change the direction of travel of the wafers being carried by transferring a wafer carrier from a driven cart moving in one direction on one track-like support to a driven cart moving in another direction on a second track-like support.

4. The system of claim 1 including means forming a plenum in said outer cover for distributing gas into the outer tunnel to prevent the surrounding atmosphere from entering the outer tunnel.

5. The system of claim 4 wherein said plenum is in the upper portion of said outer cover so that said gas can be directed downwardly toward suitable vents in the lower portion of said outer tunnel.

6. The sytem of claim 1 wherein said driven cart includes a two wheel segment and a connection pivotally mounting said segment on a second wheeled segment to enable the cart to accomodate curved movement, said connection including means to contain contaminates generated by said connection.

7. The system of claim 1 wherein said support and said covers are formed in sections of convenient length to form a system of a desired length.

8. The system of claim 1 wherein said inner and outer tracks are formed integral with said support.

9. The system of claim 1 wherein said support includes recesses for receiving the lower edges of said covers, and seal means in said recesses for forming gas tight seals.

10. The system of claim 1 wherein the magnetic means on the driver cart includes four magnets mounted on the sides of said driver cart near said inner cover and wherein the magnetic means on the driven cart is mounted on the sides of the driven cart and placed near the inside cover directly opposite to the magnets placed on the driver cart.

11. A wafer transport system for minimizing the danger of contamination to the wafers being carried by the system comprising:

a support structure having a first surface which contains a conducting means for conducting electrical power, at least one inner track which is substantially parallel to said means for conducting electrical power, and at least one outer track which is substantially parallel to said inner track a wheeled driver cart having at least two wheels in communication with said inner track, said driver cart being driven by an electric motor mounted on said driver cart, said driver cart also having a power transfer means for transferring electrical power from the electrical conducting means means of the support structure to the electric motor on the driver cart an inner cover made of magnetically permeable material which is attached to said support structure so as to form a substantially gas tight tunnel enclosing said driver cart and inner track a wheeled, driven cart which straddles said inner cover and has at least two wheels in communication with said outer track, said driven cart containing magnetic means positioned to coincide with the location of a corresponding magnetic means located on said driver cart so that sufficient magnetic force can be exerted by said magnetic means on the driver cart to cause the driven cart to track the motion of the driver cart, said driven cart also having wheels formed of a low-friction, corrosion-resistant material to further reduce particulate generation, said wheels being attached to the axles of said driven cart by low friction, low particle generating bearings, and said driven cart carrying said wafers an outer cover attached to the support structure, said outer cover substantially enclosing the driven cart and outer track to form an outer tunnel in which the driven cart can travel, said outer tunnel being substantially free of particles which can damage said wafers being transported in said driven cart and shields attached to the driven cart partially enclosing each of said wheels on said driven cart in order to deflect any particles generated away from wafers in a wafer carrier supported on the upper surface of said driven cart.

12. A conveyor system comprising:

a generally flat, track-like extruded member made of Teflon-impregnated hard anodized aluminum, said extruded member having elongated recesses formed therein, and having elongated rails forming tracks;

a driver cart supported for movement along said tracks;

a driven cart supported for movement along said tracks wherein the portions of the driven cart which engage said tracks are treated to be Teflon-impregnated, hard anodized aluminum; and cover measn cooperating with said recesses in said support structure to form a tunnel for enclosing said driven cart and isolating said driven cart from said driver cart.

13. The system of claim 12 wherein said extruded member further comprises:

elongated recesses for receiving an electrical conductor to provide power to the driven cart; and means for coupling sections of said extruded members together.

* * * * *